United States Patent
Conchieri et al.

(10) Patent No.: US 6,855,207 B2
(45) Date of Patent: Feb. 15, 2005

(54) APPARATUS AND SYSTEM FOR ELIMINATING CONTAMINANTS ON A SUBSTRATE SURFACE

(75) Inventors: Brian P. Conchieri, Essex Junction, VT (US); David D. Dussault, Burlington, VT (US); Mousa H. Ishaq, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/732,578

(22) Filed: Dec. 10, 2003

(65) Prior Publication Data

US 2004/0118810 A1 Jun. 24, 2004

Related U.S. Application Data

(62) Division of application No. 09/753,283, filed on Jan. 2, 2001, now Pat. No. 6,715,497.

(51) Int. Cl.$^7$ .............................................. H01L 21/00
(52) U.S. Cl. ..................... 118/719; 118/715; 118/724
(58) Field of Search ................................. 118/715, 724, 118/725, 728, 719; 156/345.331, 345.32, 345.37

(56) References Cited

U.S. PATENT DOCUMENTS

| | | | |
|---|---|---|---|
| 3,279,946 A | 10/1966 | Schaarschmidt | |
| 5,238,871 A | 8/1993 | Sato | |
| 5,281,274 A | * | 1/1994 | Yoder ........................ 118/697 |
| 5,352,636 A | 10/1994 | Beinglass | |
| 5,403,434 A | 4/1995 | Moslehi | |
| 5,561,087 A | 10/1996 | Mikata | |
| 5,578,133 A | 11/1996 | Sugino et al. | |
| 5,714,036 A | 2/1998 | Wong et al. | |
| 5,725,677 A | 3/1998 | Sugino et al. | |
| 5,879,459 A | 3/1999 | Gadgil et al. | |
| 5,968,279 A | 10/1999 | MacLeish et al. | |
| 5,998,283 A | 12/1999 | Takamizawa et al. | |
| 6,239,044 B1 | * | 5/2001 | Kashiwagi et al. ......... 438/787 |
| 6,300,600 B1 | * | 10/2001 | Ratliff et al. ............... 219/390 |

OTHER PUBLICATIONS

Dry Wafer Cleaning by Use of a Reducing Plasma, J. E. Drew, IBM Technical Disclosure Bulletin, vol. 34, No. 4A, Sep. 1991, p. 226.

* cited by examiner

*Primary Examiner*—Michael Barr
*Assistant Examiner*—Saeed Chaudhry
(74) *Attorney, Agent, or Firm*—DeLio & Peterson, LLC; Kelly M. Reynolds; William D. Sabo

(57) ABSTRACT

An intergrated closed apparatus and system for eliminating contaminants including metallic and/or hydrocarbon-containing contaminants on a surface of a semiconductor substrate. The apparatus and system include a heating chamber for heating the contaminated substrate to an elevated temperature, and an input line for purging the chamber with a chlorine-containing gas. The chlorine dissociates from the chlorine-containing gas, reacts with the contaminates, and forms volatile chloride byproducts which are removed from the heating chamber via an output line. A cooling chamber of the apparatus and system having an input line for providing a gas therein cools the substrate. A workpiece holds the substrate, which in turn, is held in position by a pedestal. The pedestal is in contact with a door that seals the closed apparatus and system, whereby the door transfers the substrate from the heating chamber to the cooling chamber, and vice versa.

15 Claims, 2 Drawing Sheets

APPARATUS AND SYSTEM FOR ELIMINATING CONTAMINANTS ON A SUBSTRATE SURFACE

This application is a divisional of application Ser. No. 09/753,283 filed Jan. 2, 2001, now U.S. Pat. No. 6,715,497.

BACKGROUND OF THE INVENTION

1. Field of the Invention

The present invention relates generally to a method and apparatus for fabricating semiconductor devices and, in particular, to a method and apparatus for cleaning a substrate surface by, for example, eliminating polysilicon defects induced by metallic contaminants.

2. Description of Related Art

In the production of semiconductor devices, a semiconductor substrate, such as a silicon substrate, may be formed comprising a number of varying block levels or layers whereby such block levels may include various structures formed over the semiconductor substrate. For example, block levels may include varying structures over the silicon substrate which define the semiconductor devices such as resistors, PFET wells and NFET wells in CMOS technology, and the like.

As will be recognized, the varying structures, or varying block levels, may be made by processes including photolithography, ion implant, resist strip, wet cleaning processes, and the like. An inherent problem of these block levels, and the processes used to define them over the silicon substrate, is that they produce contaminants including, for example, metallic contaminants and hydrocarbon-containing contaminants over the substrate which remain thereon to contaminate the surface. During the semiconductor manufacturing process, contaminants including metallic contaminants and hydrocarbon-containing contaminants may be deposited on both the substrate front-side (chip side) and back-side. Front-side contaminants are typically introduced from trace metallics in the photoresist while backside contaminants are typically introduced from the semiconductor processing equipment such as, for example, automated substrate handlers and chucks. This invention addresses both substrate front-side and back-side metallic removal.

As will be further recognized, if the metallic contaminants are not removed from the substrate front-side or back-side prior to either the gate oxidation or the polysilicon deposition processes, a gross defect may be induced. It is preferable to remove the contaminants prior to gate oxidation to reduce the potential for gate oxide "pinholes". These "pinholes" can render the device either non-functional or unreliable due to poor gate oxide integrity. Additionally, removal of the metallic contaminants will prevent the formation of polysilicon defects, herein referred to as "peppery polysilicon", which can result in shorts between polysilicon lines.

The microelectronics industry has faced problems with peppery polysilicon since it first started using polysilicon as a gate conductor. Several techniques are aimed at controlling peppery polysilicon including, for example, reducing the metallics within the deposited photoresist, and improving both the dry steps and wet clean steps used to define the various block levels. However, such prior art techniques do not completely eliminate the metallic contaminants over the substrate surface, and thus do not prevent the occurrence of peppery polysilicon. Therefore, known techniques can still lead to semiconductor failure in the field.

Prior art is also directed to controlling contaminants within the deposition tools used for gate formation. For instance, in U.S. Pat. No. 3,279,946, a process is disclosed wherein a reactor chamber, or a conventional semiconductor deposition tool, is preconditioned prior to a semiconductor material deposition. The tool is preconditioned by heating the reactor in the presence of a reactant gas, preferably HCl or chlorine, which reacts with donor impurities on the walls of the chamber to merely remove impurities in the reactor prior to a semiconductor material deposition on a clean wafer. This approach is problematic as the chlorine eventually induces corrosion of the deposition tooling in the reactor whereby the corrosion can actually increase metallic contamination during the semiconductor material deposition. Since the prior art does not describe any in-situ cleaning of metal contaminants from a substrate surface, or cleaning of the corroded deposition tooling, peppery polysilicon will likely result and the semiconductor may fail.

Furthermore, as semiconductor technologies, such as CMOS technologies, continue to decrease in size, and thus require thinner transfer gate oxides, the known cleaning and/or metallic contamination removal processes do not completely clean the substrate surface and/or eliminate metallic contaminants from the substrate surface. For example, the process of removing metallic contaminants from a substrate surface using a chlorinated environment during gate oxidation transfer processes is used for thick gate oxide depositions. In such processes, the metallics are removed as a result of the substrate being exposed to the chlorinated environment for the extended period of time it takes to deposit the thick gate oxide. However, such techniques are not effective or efficient in removing metallic contaminants from substrates having thin gate oxide. To produce the thinner gate oxide the substrate will be exposed to the chlorinated environment for a limited time since the gate oxide deposition time is reduced to produce the thinner gate oxide. Thus, metallic contaminants may remain on the thin gate oxide resulting in peppery polysicon, as well as pinholes in the thinner gate oxide, whereby gate oxide integrity may be compromised, and polysilicon shorts and semiconductor failure may occur.

Bearing in mind the problems and deficiencies of the prior art, it is therefore an object of the present invention to provide a method and apparatus which cleans and/or removes contaminants, including metallic contaminants and hydrocarbon-containing contaminants, from a surface of a substrate to provide the substrate with a clean surface for uniform gate formation.

It is another object of the present invention to provide a method and apparatus to clean and/or reduce residual metallic contamination on a surface of a semiconductor substrate after completion of all block levels.

A further object of the present invention is to provide a method and apparatus to clean and/or reduce residual metallic contamination on a surface of a semiconductor substrate prior to sacrificial oxide removal.

Another object of the present invention is to provide a method and apparatus of preventing oxides formed on a semiconductor substrate surface prior to gate formation.

Still another object of the present invention is to provide a method and apparatus of forming a clean surface on a semiconductor substrate to provide for a high quality gate oxide transfer.

It is also an object of the present invention to provide a method and apparatus for the uniform formation of a gate oxide layer across the surface of a semiconductor substrate.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of eliminating metal contaminants on a surface of a semiconductor substrate. The method comprises the steps of providing a semiconductor substrate which may have metallic contaminants and/or hydrocarbon-containing contaminants on a surface thereof into a mainframe. The pressure and atmosphere of the mainframe is then evacuated to an oxygen-free environment at a pressure of less than about 1 Torr. Subsequently, the semiconductor substrate is heated to an elevated temperature, preferably to a temperature ranging from about 500° C. to about 700° C. for a time ranging from about 5 minutes to about 30 minutes, within the mainframe. While heating the substrate, the substrate is simultaneously purged and a surface thereof contacted with a chlorine-containing gas, preferably HCl or $Cl_2$ by a chemical vapor deposition process, which may form volatile metallic byproducts with metallic contaminants and/or volatile byproducts with the hydrocarbon-containing contaminants thereover the substrate surface. During the heating and purging of the semiconductor substrate in the mainframe, the surface of the substrate is cleaned and/or volatile byproducts may be removed from the surface of the semiconductor substrate to provide a semiconductor substrate having a clean surface.

In the preferred embodiment, the substrate to be cleaned which may have metallic contaminants and/or hydrocarbon-containing contaminants on a surface thereof preferably comprises a silicon substrate with a plurality of block levels thereover which may contaminate the surface of the substrate by providing thereover metallic contaminants comprising metals including transition metals, inner-transition metals, and metalloids, and/or hydrocarbon-containing contaminants. Alternatively, a plurality of semiconductor substrates to be cleaned and/or which may have the contaminants on surfaces thereof may be provided into the mainframe whereby the substrates are retained by a workpiece during the heating, purging and cleaning process of removing metallic and/or hydrocarbon-containing contaminants from the surfaces of the substrates within the mainframe.

In the preferred embodiment, the apparatus for cleaning and/or eliminating metallic and/or hydrocarbon-containing contaminants on a surface of a semiconductor substrate comprises a mainframe having at least one workpiece holder adapted to hold a semiconductor substrate which may have metallic and/or hydrocarbon-containing contaminants on a surface thereof, at least one heating element adapted to heat the mainframe to an elevated temperature, at least one input line adapted to provide the chlorine-containing vapor into the mainframe, at least one output line adapted to remove the volatile byproducts from the mainframe, and at least one cooling chamber adapted to cool the semiconductor substrate having the clean surface. More preferably, the heating chamber comprises the at least one component for heating the semiconductor substrate to the elevated temperature, the at least one component for providing the chlorine-containing gas over and contacting the surface of the substrate to form the volatile byproducts with the metallic and/or hydrocarbon-containing contaminants, and the at least one component for removing the volatile byproducts from the closed heating chamber within the closed mainframe.

More preferably, the semiconductor substrate is adapted to be continuously heated in the mainframe wherein the mainframe is a closed mainframe comprising at least the heating chamber and the cooling chamber directly in contact with each other. The heating chamber of the mainframe may comprise a closed heating chamber whereby a door seals the heating chamber from at least one other chamber within the mainframe, preferably from the cooling chamber. In such an embodiment, the mainframe further comprises a means for transferring the semiconductor substrates directly from the cooling chamber to the heating chamber and vice versa. Preferably the means for transferring the semiconductor substrates from one chamber to the other is the at least one workpiece holder adapted to hold a semiconductor substrate which may have metallic and/or hydrocarbon-containing contaminants on a surface thereof comprising a pedestal whereby the substrates are provided over and secured to the pedestal.

Once the substrates to be cleaned and/or which may have metallic and/or hydrocarbon-containing contaminants on surfaces thereof are provided within the mainframe, the pressure and atmosphere of the mainframe are then evacuated to an oxygen-free environment preferably to a pressure ranging from about 50 mTorr to about 400 mTorr. In the preferred embodiment, the substrates are provided over the pedestal whereby the pedestal transfers the substrates from the cooling chamber to the heating chamber within the closed mainframe. The door then seals the heating chamber to provide the closed heating chamber whereby the semiconductor substrate is then adapted to be continuously heated in the heating chamber to the elevated temperature.

In the present invention, the chlorine-containing gas, at the elevated temperature, is adapted to clean the substrate surface and/or form the volatile metallic byproducts whereby chlorine dissociates from the chlorine-containing gas to react with the metallic contaminants thereby forming the volatile byproducts which may be removed from the surface of the substrate. Preferably, the volatile metallic and/or hydrocarbon-containing byproducts are removed from the substrate surface prior to providing a gate oxide layer over said substrate surface and prior to removal of a sacrificial oxide.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
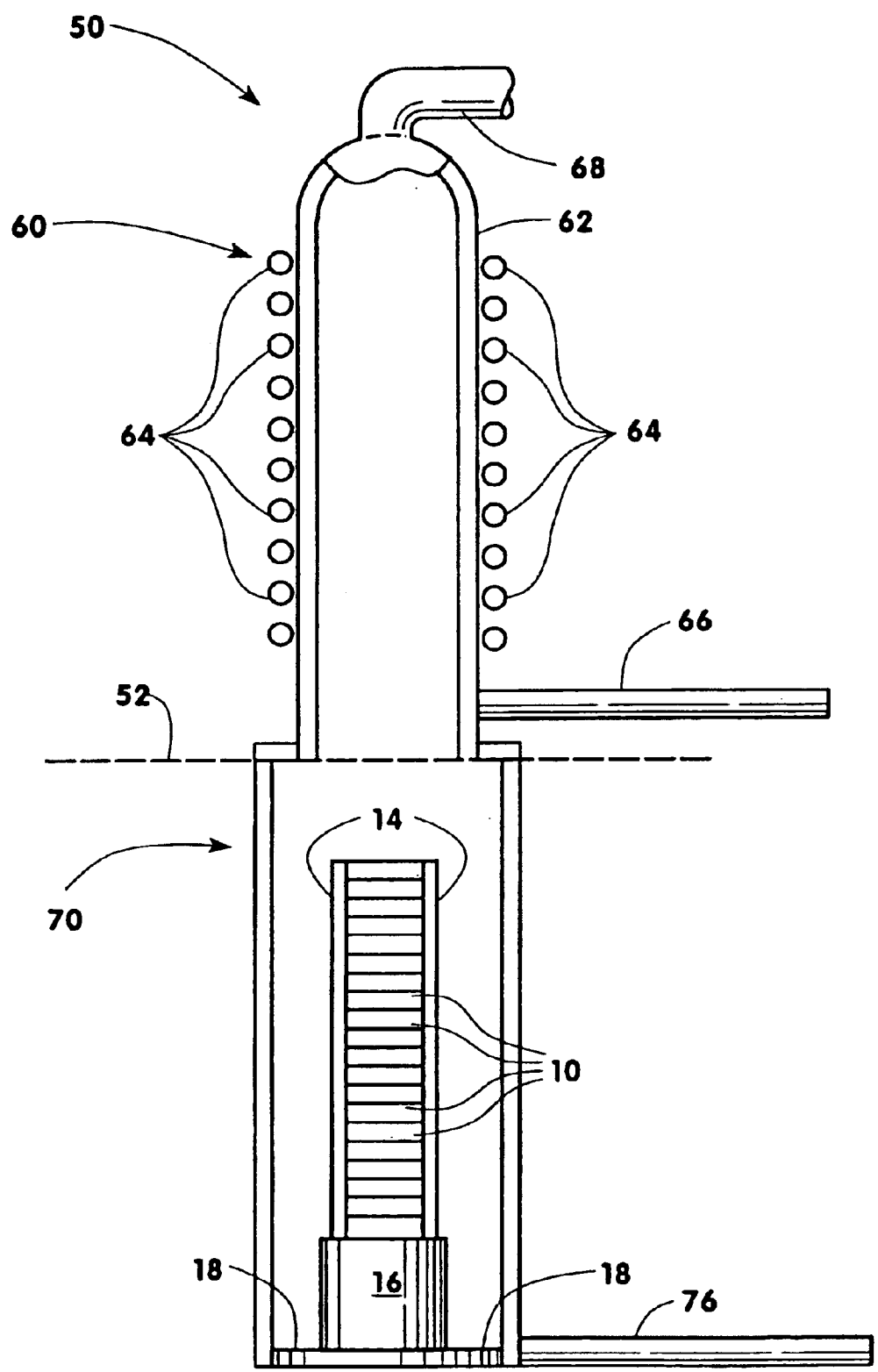
FIG. 1 is a schematic diagram of a closed mainframe system of the present invention having a heating chamber and a cooling chamber whereby a plurality of substrates to be cleaned which may have metallic and/or hydrocarbon-containing contaminants on a surface thereof are positioned within the cooling chamber of the closed system.

In describing the preferred embodiment of the present invention, reference will be made herein to FIGS. 1–2 of the drawings in which like numerals refer to like features of the invention. Features of the invention are not necessarily shown to scale in the drawings.

It has been found that by using a chlorine-containing gas at elevated temperatures, within an integrated closed system, cleans a substrate surface by converting contaminants over the surface thereof to form volatile chlorides which are then removed from the system to provide a clean substrate surface. The present invention is aimed at overcoming the problems associated with the defects caused by peppery polysilicon due to metallic contaminants and the problems associated with hydrocarbon-containing contaminants over the surface of the substrate. For example, metallic contaminants on a substrate surface may be converted to the volatile chloride byproducts of such metal components, or alternatively hydrocarbon-containing contaminants, for example oils and greases, on a substrate surface may be converted to carbon chloride byproducts of such hydrocarbon-containing contaminants. In the present invention, the semiconductor substrate may be contaminated and provided within the integrated closed system to clean the substrate surface, or alternatively, a substrate which may be contaminated may be provided within the integrated closed system as a preventative measure for providing a clean substrate surface. Once the volatile chloride byproducts of the contaminants are formed, they may then be removed from both the surface of the substrates and the closed system to provide a substrate surface free of contaminants thereby providing the substrate with a clean surface for uniform gate formation, for example, free of metallic contaminants to avoid peppery polysilicon prior to gate oxide deposition.

In the present invention, the substrate is placed within a heating chamber of the integrated closed system and heated to an elevated temperature while simultaneously contacting and purging the substrate surfaces which may have the contaminants with the chlorine-containing gas. During such process, the chlorine of the chlorine-containing gas dissociates from the chlorine-containing gas at the elevated temperatures to react with contaminants on the surface of the substrate to form volatile chlorides. For example, the dissociated chlorine may react with the metallic contaminants on a surface of the substrate to form volatile metallic chlorides which are then pumped out of the furnace while the closed system continuously heats and purges the substrate with the chlorine-containing gas. Subsequently, the cleaned substrate is moved to a cooling chamber within the integrated closed system and cooled for subsequent substrate finishing procedures.

In the preferred embodiment, the present method of continuously heating, purging and cleaning the substrate surface with the chlorine-containing gas to clean and/or remove the formed volatile chloride byproducts to provide a clean substrate surface is preferably performed after the substrate has received all block levels but prior to receiving the gate oxidation process. Using the method and apparatus of the present invention, while within the continuous and uninterrupted closed system, a semiconductor substrate surface, such as a silicon substrate surface, is cleaned of contaminants without effecting or etching the underlying silicon substrate. This permits the formation of a uniform gate layer, such as a gate oxide layer, across the surface of the substrate.

Further, by integrating the heating, purging and formation of the volatile chloride byproduct processes under a constant furnace, and subsequently cooling the substrate within the integrated closed system, the cleaned substrate is not exposed to air, or oxygen, during such steps. Integrating these steps in a continuous closed system prevents exposing the cleaned substrate surface to air and greatly reduces the probability that oxygen will react with contaminants to form oxides over the surface of the substrate. In cleaning or eliminating the contaminants from the substrate surface, eliminating the exposure of the substrate to oxygen during cleaning of the substrate results in a more uniform formation of a subsequent gate oxide layer, without additional, and at times ineffective, substrate cleaning steps. As used herein, the terms "clean", "cleaned", "pre-clean" and "cleaning" each refer to the removal of the contaminants or other impurities from a surface of a semiconductor substrate. Subsequently, uniform gate oxide and polysilicon layers may be formed over the cleaned substrate surface, whereby additional substrate cleaning steps are not required to remove remaining contaminants.

Figure 2:
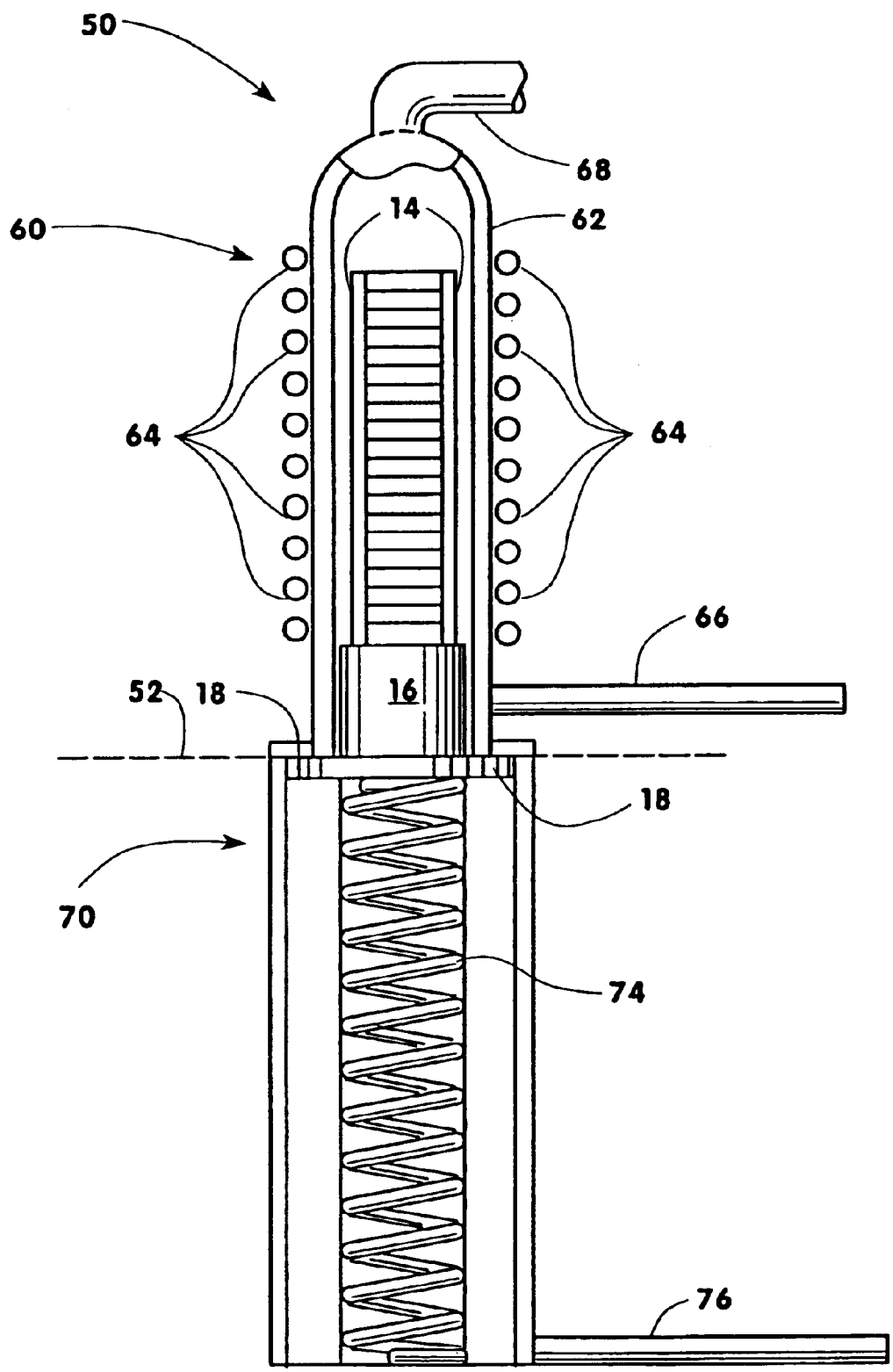
FIG. 2 is a schematic diagram of the closed mainframe system of FIG. 1 whereby the plurality of substrates to be cleaned which may have metallic and/or hydrocarbon-containing contaminants on surfaces thereof have been transferred to the heating chamber for removal of metallic contaminants from the substrate surfaces.

As illustrated in FIG. 1, an integrated, continuous closed system, is preferably used to heat, purge, and clean a surface of substrate 10 by, for example, removing contaminants including metallic contaminants and hydrocarbon contaminants from the surface thereof and subsequently cool the substrate 10 whereby each step is performed within the integrated, oxygen-free closed system. The preferred integrated closed system of the present invention comprises a mainframe 50 which may have one or more chambers, such as 60 and 70, integrated within mainframe 50. Preferably, the mainframe 50 of the integrated closed system comprises at least one heating chamber 60 and at least one cooling chamber 70 as separated by the dashed line of reference numeral 52. The substrate 10 is heated, purged, and volatile chloride byproducts removed within the heating chamber 60, and the substrate is then cooled, or allowed to equilibrate to ambient temperature, in the cooling chamber 70. Furthermore, the mainframe 50 may also include a mechanism to transfer a workpiece having a plurality of substrates 10 between chambers without interrupting the integrated closed system, as well as a plurality of input and output lines for introducing and removing gases from the mainframe 50, respectively.

In the preferred embodiment, the integrated closed system having mainframe 50 preferably comprises a furnace such as, for example, a Low Pressure Chemical Vapor Deposition furnace, a Rapid Thermal Chemical Vapor Deposition (RTCVD) single wafer process chamber. As it will be recognized by one skilled in the art, similar process conditions as those defined in the present invention may be used when employing a RTCVD process. As illustrated in FIG. 1, a plurality of semiconductor substrates or wafers 10 which may have contaminants including metallic contaminants and hydrocarbon contaminants on surfaces thereof, or alternatively may not have contaminants on a surface thereof, are provided within mainframe 50. The plurality of semiconductor substrates 10 are provided within a means for holding the substrates, such as, a boat, or workpiece 14 within the mainframe 50. The workpiece 14 having the substrates 10 is provided over the mechanism to transfer the workpiece, or substrates 10, between chambers without interrupting the integrated closed system. In the preferred embodiment, the mechanism to transfer the workpiece 14 within the mainframe 50 comprises a pedestal 16 provided over a door 18. The pedestal 16 holds workpiece 14 in position while door 18 moves the workpiece from one chamber to another within the mainframe 50. Door 18 is further adapted to seal workpiece 14 having the substrates 10 within the heating chamber of the integrated closed system.

As shown in FIG. 1, the workpiece 14 holds the plurality of semiconductor substrates 10 over the pedestal 16 and door 18 whereby the workpiece 14 having the substrates 10 is first provided within the cooling chamber 70 of the mainframe 50. Subsequently, the workpiece 14 having substrates 10 is transferred to the heating chamber 60, as illustrated in FIG. 2, whereby the substrates are heated, contacted and purged with the chlorine-containing gas, and the gaseous chloride byproducts removed. Next, the container 14 having the substrates 10 is transferred from the heating chamber 60 to the cooling chamber 70 within mainframe 50 for cooling.

In the present invention of cleaning the substrate and/or eliminating contaminants from the surface thereof, including metallic contaminants and hydrocarbon contaminants, the substrate 10 may comprise a silicon substrate comprising a plurality of varying block levels. Such block levels may include processes that define various substrates such as resistors, PFET wells and NFET wells in CMOS technology, and the like. In defining the various substrates, the plurality of varying block levels may comprise processes including photolithography, ion implant, resist strip, wet cleaning processes, and the like. Preferably, all block levels have been completed on the plurality of substrates 10. As will be recognized, such processes may produce contaminants including metallic contaminants and hydrocarbon contaminants over both front and back surfaces of the substrate remaining thereon to contaminate the surface. In contaminating the surface of the substrate with metallic contaminants, the metal contaminants are typically introduced as trace metallic contaminants in a photoresist over portions of the substrate which may define the gate. As will be further recognized, these trace metallic contaminants may comprise any transition metal, inner-transition metal, or metalloid as used in the art of the varying block level process. Such metals include, but are not limited to, aluminum, chromium, iron, and the like.

In the present invention, the plurality of substrates 10, which may have contaminants over a surface thereof, are provided over the pedestal 16 (typically made of stainless steel) whereby the pedestal is disposed on the door 18 (typically made of stainless steel). The substrates 10, which may have contaminants over a surface thereof, are then introduced into mainframe 50, more preferably into cooling chamber 70, whereby mainframe 50 is subsequently closed to provide the integrated closed system of mainframe 50. Subsequently, mainframe 50, and each of the chambers integral thereto, will be evacuated to a typical pressure and environment such as nitrogen environment preferably at a pressure under 1 Torr, even more preferably in the range of about 50 mTorr to about 400 mTorr.

After the substrates 10 which may have contaminants over a surface thereof, including metallic contaminants and hydrocarbon contaminants, have been provided within the cooling chamber 70 of the integrated closed system, and such system has been evacuated, the substrates 10 will then be transferred to the heating chamber 60 without breaking the continuous closed system of mainframe 50 by any conventional process or mechanism, preferably by the transferring means of door 18. Preferably, the heating chamber 60 is a furnace comprising a tube 62. The heating chamber 60 or furnace may also include conventional heating elements 64 for providing heat to the furnace, at least one input line 66 for providing a chlorine-containing gas to the heating chamber, and at least one output line 68 for removing the volatile chloride byproducts formed.

Once substrates 10 which may have contaminants over a surface thereof are placed within the heating chamber 60 door 18 seals the heating chamber 60 to provide the closed, sealed heating chamber 60 within the integral closed system of mainframe 50. Subsequently, the heating chamber 60 is heated by heating elements 64 to an elevated temperature while simultaneously the substrates, including surfaces thereof, are contacted by and purged with the chlorine-containing gas from the at least one input line 66. Heating elements 64 heat the chamber to an elevated temperature ranging from about 500° C. to about 700° C. for a time ranging from about 5 minutes to about 30 minutes, or alternatively for a period of time at which all of contaminants over the substrate surface have been removed. While simultaneously heating, the heating chamber 60 is provided with the chlorine-containing gas from line 66 at a substantially constant pressure under 1 Torr, but preferably in the range of about 50 Torr to about 400 mTorr. The chlorine containing gas may comprise HCl, $Cl_2$, and the like. In heating the chlorine-containing gas to such elevated temperatures, the chlorine molecules spontaneously dissociate from the chlorine-containing gas to form volatile, gaseous chloride byproducts with the contaminants over the surface of the substrates 10 within the closed heating chamber of closed mainframe 50. At least one output line 68 of the heating chamber removes the volatile chloride byproducts from the heating chamber while the substrate is being heated and purged with the chlorine-containing gas.

In the present invention, in heating the heating chamber 60, the temperature of substrates 10 is preferably maintained at about 500° C. to 700° C. during the contamination elimination process which cleans the substrate surface.

In the preferred embodiment, the heating chamber having substrates 10 which may have the contaminants on a surface thereof is heated to a temperature of about 625° C. for about 20 minutes while the chamber and substrate are purged with the chlorine-containing gas comprising a chlorine gas. In heating the chlorine gas to temperatures ranging from about 500° C. to about 700° C. for about 20 minutes, the chlorine molecules spontaneously dissociate from the hydrogen in the chlorine gas to form the volatile, gaseous byproducts with the contaminants on the surface of the substrates 10 within the closed heating chamber of closed mainframe 50. For example, wherein the substrates 10, within heating chamber 60, which may have metallic surface contaminants comprising aluminum, chromium, and iron, is heated to about 625° C. for about 20 minutes, and the chlorine is heated to such temperatures, the chlorine dissociates from the hydrogen to react with the aluminum, chromium, and iron to form volatile, gaseous metallic byproducts comprising $Al_xCl_y$, $Cr_xCl_y$, and $Fe_xCl_y$. During such process, the volatile, gaseous metallic byproducts comprising $Al_xCl_y$, $Cr_xCl_y$, and $Fe_xCl_y$ are removed by the at least one output line 68 within heating chamber 60 to provide a clean substrate 10 for subsequent finishing processes, such as for formation of a "pinhole" free gate oxide and subsequent defect-free, or peppery polysilicon-free, polysilicon film. In the present invention, the volatile, gaseous metallic byproducts may be evacuated by a conventional evacuation or exhaust line with heating chamber 60 or furnace at a constant pressure under 1 Torr, more preferably in the range of about 50 mTorr to about 400 mTorr. Alternatively, wherein the contaminants on the surface of the substrate include hydrocarbon contaminants, the chlorine dissociates from the hydrogen to react with the hydrocarbon to form volatile carbon chlorides which are then removed from the mainframe.

After cleaning and/or eliminating or removing any contaminants from the surface of substrates 10, substrates 10 may then be transferred to the cooling chamber 70 of the mainframe 50. Once the substrates 10 are positioned in the cooling chamber 70 the substrates may then be cooled. As illustrated in FIG. 1, the cooling chamber further comprises at least one input line 76 for providing a oxygen-free gas, such as nitrogen, helium, and the like, to the cooling chamber to cool the clean surfaced substrates 10. In the preferred embodiment, a $N_2$ cooling process cools the clean substrates relatively free from oxygen to prevent formation of oxides on the surface of the substrate.

In the present invention, the steps within the integral closed system of simultaneously heating the substrate which may have metallic contaminants over the surface thereof, purging the substrate with the chlorine-containing gas, and removing formed volatile metallic chloride byproducts within the heating chamber and subsequently cooling the substrates within the cooling chamber are preferably performed prior to the removal of the sacrificial oxide, over which all of the block level processing was performed, and prior to formation of the gate oxide.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An apparatus for cleaning a semiconductor substrate, said apparatus comprising:

a closed mainframe having therein interior heating and cooling chambers and a semiconductor substrate having a sacrificial oxide layer fully covering a surface thereof with—contaminants over said oxide layer;

at least one workpiece holder within said mainframe holding said semiconductor substrate;

a transfer mechanism within said mainframe holding said workpiece holder in position;

a door sealing said mainframe, said transfer mechanism being in contact with said door for moving said workpiece holder and said contaminated semiconductor substrate from said cooling chamber to said heating chamber, and vice versa;

at least one heating element for heating said heating chamber to an elevated temperature such that said heating chamber is maintained at said elevated temperature;

at least one input line for providing a chlorine-containing vapor into said heated chamber, said chlorine-containing vapor adapted to form volatile chloride byproducts with said contaminants over said sacrificial oxide layer within said mainframe without etching said underlying semiconductor substrate;

at least one output line for removing said volatile chloride byproducts from said heating chamber; and at least one input line for providing a gas into said cooling chamber for cooling said cleaned semiconductor substrate, wherein said apparatus is for cleaning said semiconductor substrate surface by eliminating contaminants on said surface of said sacrificial oxide layer fully covering said semiconductor substrate.

2. The apparatus of claim 1 wherein said mainframe comprises a Low Pressure Chemical Vapor Deposition furnace.

3. The apparatus of claim 1 wherein said elevated temperature ranges from about 500° C. to about 700° C.

4. The apparatus of claim 1 wherein said heating chamber is heated at said elevated temperature for a time ranging from about 5 minutes to about 30 minutes.

5. A system for cleaning a semiconductor substrate comprising:

an integrated closed mainframe having therein interior heating and cooling chambers and a semiconductor substrate with a sacrificial oxide layer fully covering a surface thereof, said sacrificial oxide layer having contaminants thereon;

a workpiece holder within said integrated closed mainframe holding said semiconductor substrate;

a transfer mechanism within said mainframe holding said workpiece holder in position;

a mainframe door sealing said mainframe, said transfer mechanism being in contact with said mainframe door whereby said mainframe door moves said workpiece holder and said contaminated semiconductor substrate from said cooling chamber to said heating chamber, and vice versa;

a heating element within said heating chamber for heating said heating chamber to an elevated temperature;

an input line within said heating chamber for providing a chlorine-containing gas into said heated heating chamber for forming volatile chloride byproducts between said chlorine-containing gas and said contaminants on said sacrificial oxide layer without etching the underlying semiconductor substrate;

an output line within said heating chamber for removing said volatile chloride byproducts from said heating chamber such that said integrated closed mainframe removes said contaminants from said sacrificial oxide layer for cleaning said semiconductor substrate; and at least one input line within said cooling chamber for providing an oxygen-free gas into said cooling chamber for cooling said cleaned semiconductor substrate.

6. The system of claim 5 wherein said integrated closed mainframe has an oxygen-free environment at a pressure of less than about 1 Torr.

7. The system of claim 5 wherein said integrated closed mainframe has a pressure ranging from about 50 mTorr to about 400 mTorr.

8. The system of claim 5 wherein said elevated temperature of said integrated closed mainframe ranges from about 500° C. to about 700° C.

9. The system of claim 5 wherein said integrated closed mainframe comprises a Low Pressure Chemical Vapor Deposition furnace.

10. The system of claim 5 wherein said integrated closed mainframe comprises a Rapid Thermal Chemical Vapor Deposition furnace.

11. The system of claim 5 further including an interior door between said first and second interior chambers.

12. The system of claim 5 wherein said chlorine-containing gas within said integrated closed mainframe comprises HCl or $Cl_2$.

13. The system of claim 5 wherein said volatile chloride byproducts of said contaminants comprise volatile metallic byproducts of metals selected from the group consisting of transition metals, inner-transition metals, and metalloids.

14. The system of claim 5 further including a plurality of contaminated semiconductor substrates held within said workpiece holder within said integrated closed mainframe for cleaning thereof.

15. A system for cleaning a semiconductor substrate comprising:

an integrated closed mainframe having a heating chamber and a cooling chamber;

a workpiece holder within said integrated closed mainframe holding a semiconductor substrate, said semiconductor substrate having a sacrificial oxide surface layer fully covering said semiconductor substrate with contaminants thereon;

a heating element within said heating chamber for heating said heating chamber to an elevated temperature such that said heating chamber is at said elevated temperature;

an input line said heating chamber for providing a chlorine-containing gas into said heating chamber for forming volatile chloride byproducts between said chlorine-containing gas and said contaminants on said sacrificial oxide layer without etching the underlying semiconductor substrate;

an output line within said heating chamber for removing said volatile chloride byproducts from said heating chamber such that said contaminants are removed from said sacrificial oxide layer for cleaning said semiconductor substrate;

an input line within said cooling chamber for providing an oxygen-free gas into said cooling chamber for cooling said cleaned semiconductor substrate;

a mainframe door sealing said mainframe; and a pedestal within said integrated closed mainframe holding said workpiece holder in position, said pedestal being connected to said mainframe door for transferring said semiconductor substrate held within said workpiece holder from said heating chamber to said cooling chamber, and vice versa, via said mainframe door.

* * * * *